United States Patent [19]
Polonis et al.

[11] Patent Number: 4,758,792
[45] Date of Patent: Jul. 19, 1988

[54] METHOD FOR UTILIZING A SPHERICAL DIPOLE PROBE FOR DETECTING FAULTS IN HIGH VOLTAGE TRANSMISSION LINE INSULATORS

[75] Inventors: James J. Polonis; John P. Harrell, Jr.; Melvin J. Johnson, all of San Antonio, Tex.

[73] Assignee: Southwest Research Institute, San Antonio, Tex.

[21] Appl. No.: 776,155

[22] Filed: Sep. 13, 1985

[51] Int. Cl.[4] ............... G01R 29/12; G01R 19/00; G01N 31/02
[52] U.S. Cl. .................... 324/552; 324/559; 324/456; 324/458; 324/530
[58] Field of Search ............... 324/72, 72.5, 133, 96, 324/149, 109, 457, 456, 458, 51, 52, 54, 552, 559

[56] References Cited

U.S. PATENT DOCUMENTS

| | | | |
|---|---|---|---|
| 1,366,078 | 1/1921 | Johnson | 324/51 |
| 1,896,598 | 2/1933 | Spangler | 324/51 |
| 4,266,184 | 5/1981 | Devine | 324/54 |
| 4,328,461 | 5/1982 | Butters | 324/72 |
| 4,443,764 | 4/1984 | Suh | 324/456 |
| 4,571,539 | 2/1986 | Rodriguez | 324/457 |

FOREIGN PATENT DOCUMENTS

| | | | |
|---|---|---|---|
| 502453 | 11/1954 | Italy | 324/149 |
| 0045573 | 3/1983 | Japan | 324/457 |
| 1045170 | 9/1983 | U.S.S.R. | 324/457 |

OTHER PUBLICATIONS

Spiegel: "An Improved Optically Isolated Elf Sensor'-'-1979 IEEE Symposium on EM Compatibility-pp. 429–434.
"AC Transmission Line Field Measurements", F. R. Kotter and M. Misakian; Sep. 1977.
"Model Study of Electric Field Effects in Substations", S. A. Sebo; Jan. 1978.

Primary Examiner—Reinhard J. Eisenzopf
Assistant Examiner—Jose M. Solis
Attorney, Agent, or Firm—Gunn, Lee & Jackson

[57] ABSTRACT

A method is provided for utilizing a nonintrusive, noncontacting electric field sensing device to detect faults in high voltage transmission line insulators. The electric field surrounding an unfaulted insulator is mapped using a spherical dipole to obtain a characteristic reference curve. The field of a suspect insulator is then mapped to obtain a test curve which is compared with the reference curve to determine the existence of and location of a fault.

16 Claims, 2 Drawing Sheets

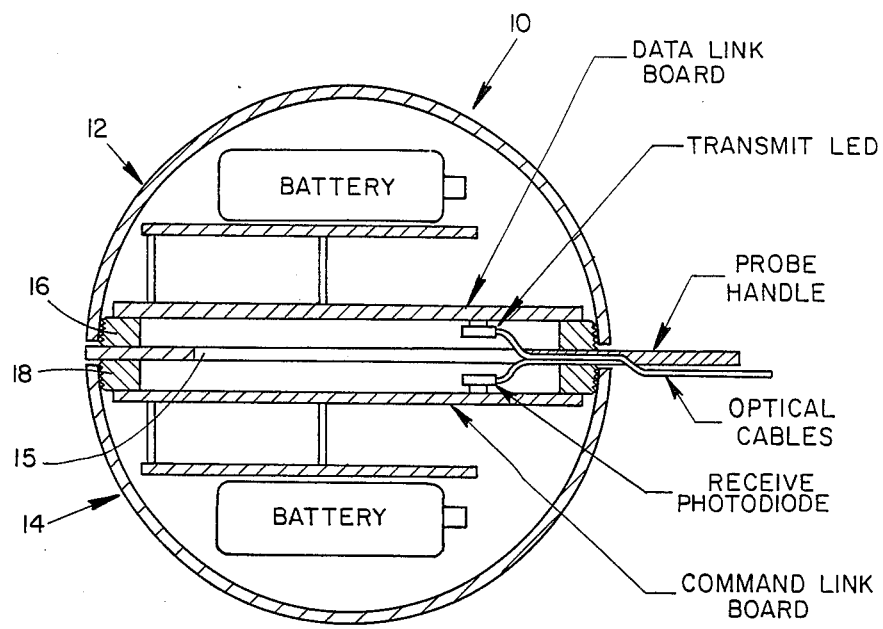
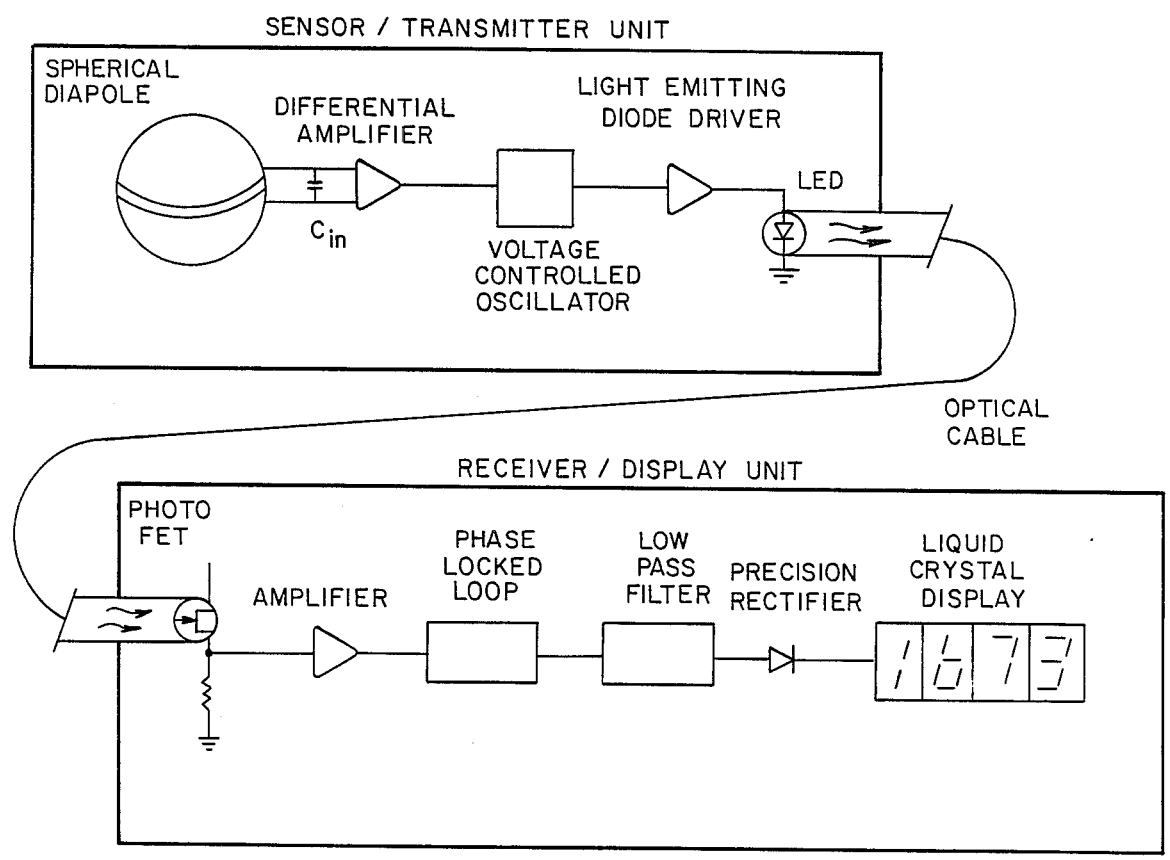
FIG.1
FIG.2

METHOD FOR UTILIZING A SPHERICAL DIPOLE PROBE FOR DETECTING FAULTS IN HIGH VOLTAGE TRANSMISSION LINE INSULATORS

BACKGROUND AND FIELD OF THE INVENTION

The present invention relates to a method for locating a fault in a high voltage transmission line insulator by measuring the electric field perturbation caused by that fault. Specifically, in the present method, a small 60 Hz sperhical dipole or other nonintrusive, noncontacting electric field sensing device may be safely employed under a wide range of environmental conditions to detect insulator failure.

High voltage transmission line insulators initially have a relatively high dielectric constant. Over time, however, various environmental factors in combination with the electric fields generated by the transmission lines can cause changes in this constant and a corresponding reduction in the quality of insulation provided. For example, extremes of heat and cold can lead to fissures in the insulating material. In arrid regions, high winds carrying sand or other airborne particles can abrade the insulator's protective ceramic covering. Furthermore, very humid conditions or salty air in coastal areas may contribute to insulator failure through the deposition of salt on insulator surfaces. Any of the above-mentioned environmental factors can lead to areas of conductivity which substantially change the insulator's dielectric constant and, therefore, could eventually cause a failure leading to a power outage.

The ability to monitor insulator quality in the field has been hindered by a lack of suitable instrumentation and test methods. The need for ongoing insulator monitoring, however, is steadily growing as right-of-way problems and costs lead to ever increasing numbers of dedicated transmission lines with no backup in case of outage.

Although faulty insulators and faulty insulator strings may be detected while they are in service, many of the current test procedures require contact with the insulator and, therefore, tedious precautionary measures must be employed. Noncontact testing methods also may be employed; however, such methods generally are not as accurate as contact methods. In general, the methods currently employed for faulty insulator detection are based upon the measurement of the voltage gradient across the individual units of a string of suspension insulators or across the parts of multi-part pin type insulators. For safety reasons, none of the existing contact test methods should be used in wet weather.

One of the most common non-contact methods of detecting faulty insulators is visual inspection to determine whether the insulator is chipped, cracked, or portions of the skirt are broken off. Also, visual inspections may be used to detect arcing or sparking from the conductor along the length of the insulator string.

Faulty insulators also may be detected by special radio inteference locators consisting essentially of a sensitive battery-operated receiver coupled to either a directional loop or which antenna. The latter type may be attached to a "hot line stick" to enable close investigation of the insulator under test.

Mechanical devices, such as "buzz sticks", may be used to detect insulator faulting by bridging an insulator and allowing the test personnel to observe any arcing or sparking, thereby indicating a faulty insulator. Use of such a device, however, requires experienced personnel to conduct the test and to obtain reliable data. Further, methods utilizing these devices are limited to relatively low voltage lines, e.g., no higher than 230 kV. Moreover, the weather must be fair and the insulator must be dry before any attempt is made at conducting the test.

A number of fault detection methods based on live-line insulator test devices are currently available. These devices require bridging an insulator, measuring the voltage distribution on it and comparing the values to the others in the insulator string. These units are equipped with a meter or buzzer mechanism which informs the linemen of questionable units. Again, these systems are limited by environmental conditions and can only be used on lower voltage lines, e.g., no higher than 230 kV.

Another prior art insulator fault detection system pulses an insulator with an 80 kV pulse. If the insulator is defective, the operator hears an audible buzz from the instrument's associated circuitry. This system has some inherent problems, however, as evidenced by a number of documented cases in which this device caused an insulator to explode when the high voltage was applied, killing or seriously injuring even experienced linemen.

As was discussed above, most of the prior art methods and devices for detecting faults in insulator strings require physical contact of the testing device with the insulator. Physical contact of the device to be tested, however, often contributes to inaccuracies in test results and, in many cases, to an increased hazard for the test system operator. Prior art noncontact test methods, such as radio interference and visual inspection, generally provide a greater margin of safety for the operator but a lower degree of accuracy. The nonintrusive, noncontacting test method described hereinbelow represents an improvement over the test methods described above both in terms of increased accuracy and increased safety.

SUMMARY OF THE INVENTION

In accordance with the present invention, a method for detecting faults in an on-line insulator string using a spherical dipole comprises the following steps:

A spherical dipole is moved to the top of an insulator string separating and carrying high voltage power transmission lines and is placed in the electric field associated with the string, but not in direct contact with any of the individual insulators. The electric field associated with the string results from the potential difference between opposite ends of the insulator string while the transmission line carries the high voltage.

The dipole is moved from the top to the bottom of the string while taking readings of the strength of the electric field at each point. This procedure is first performed on an undamaged insulator string in order to obtain a reference set of data correlatable with such unfaulted string. The procedure is then repeated at a later time on that same insulator string. Data from each of the procedures is processed and graphed to obtain curves representative of the electric field associated with the string at the different points in time. The curves may then be compared to determine whether there has been a shift in the strength of the electric field of the string over time. A shift in the apex of the suspect curve relative to that of the reference curve indicates the existence of a fault. A microprocessor-based system may be utilized to correlate data corresponding to undamaged versus damaged insulators. The output of the microprocessor system may be in the form an audible sound or a thermoprinter output in graphical form.

The method described above may be used to obtain initial data corresponding to an individual string in its unfaulted condition, which data may compared to later field measurements of the same string to determine whether there has been any deterioration in the string's insulating capacity. The method may also be used to compare field data from individual strings with data obtained from a reference insulator string. Strings with data falling outside the limits of the benchmark data obtained from the reference string would either be replaced or noted for further testing.

DESCRIPTION OF THE DRAWINGS

FIG. 1 is a cross-sectional side view of the spherical dipole detector utilized in the method of the present invention.

FIG. 2 is a block diagram schematic representation of the test system components utilized in the method of the present invention.

DETAILED DESCRIPTION OF THE PREFERRED EMBODIMENT

Figure 3:
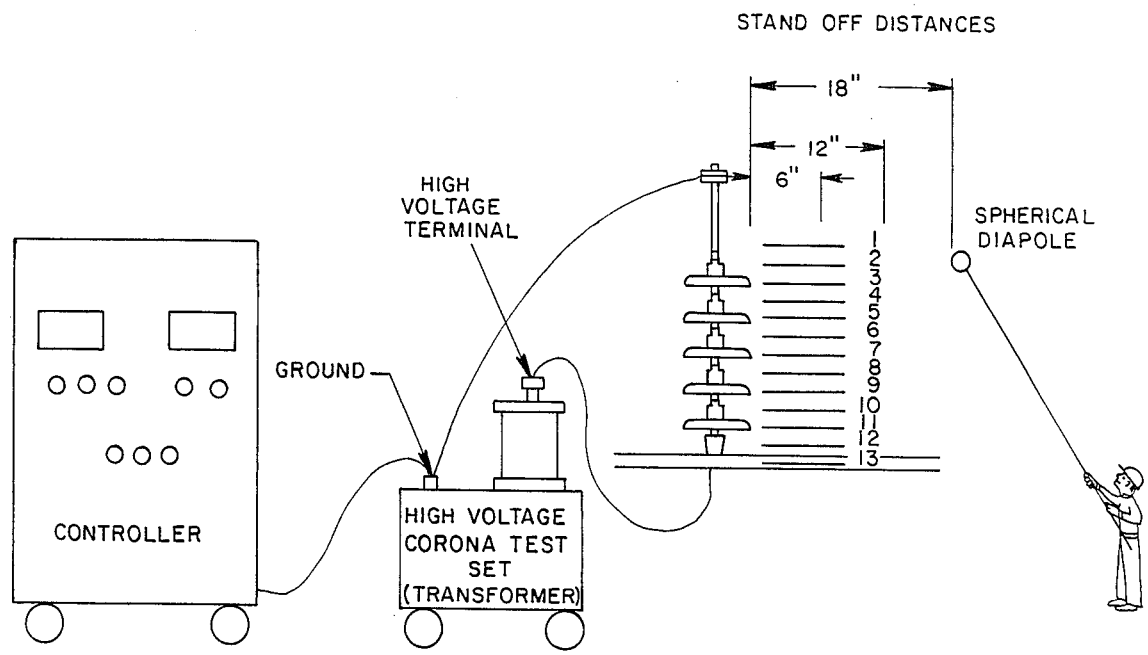
FIG. 3 is a pictorial representation of a test setup utilizing the method of the present invention.

The method of the present invention is based upon the theoretical concept that all electrically energized conductors are surrounded by an electric field whose intensity at any given point is a function of two factors. The first factor is the potential (voltage) of the conductor with respect to the potential of a reference point. The second factor is the location of a given point with respect to the conductor and the reference point.

An insulator string, when clean and dry, can typically be described as a string of capacitors. The distribution of charge is usually nonuniform, mainly as a result of the capacitance between insulator units and ground. Graphing the electric field from a clean, dry insulator string results in a parabola with the apex of the parabola corresponding to the middle of the insulator string. Such a graph of the electric field around the insulator string is obtained by the present invention using a nonintrusive, noncontacting electric field sensing device comprising a spherical dipole, as described more fully hereinbelow.

An unfaulted insulator string will provide a uniform, low conductivity path between a high voltage power line and a grounded support. The space charge along this insulator string is fairly constant. However, if an individual insulator within a string of insulators were to become conductive, it would create an increase in the space charge resulting in a buildup and distortion in the surrounding electric field. Data points corresponding to the electric field may be plotted in order to obtain a graphical representation of the distortion appearing in the form of a skew in the graph.

The electric field intensity assumes a characteristic curve for any given number of data points. The technique of obtaining this characteristic curve is commonly known as field "mapping." The presence of any additional conductors in the field will cause the characteristic curve to change its amplitude or shape. In the case of an insulator string, a flaw, fault, or change in dielectric strength in the string results from the introduction of a "conductor." Thus, if the normal curve around an unfaulted insulator string has been characterized, a different curve will be noted when mapping around a flawed or faulted insulator string. Such a mapping is accomplished in the present method by the use of a small spherical dipole.

The electric field plots obtained with the probe of the present invention result from a methodical series of measurements along an insulator string. Typically, each of the insulators in the string comprises a metal cap and a skirt formed of a suitable insulating material. A set of reference data corresponding to an unfaulted insulator string is obtained using the following procedure: The probe is preferably positioned about 6" from the outside vertical line of the insulator skirt to be tested. Individual measurements are made at point midway on the metal cap and at a point near the bottom of the skirt of each insulator. The values obtained are graphed with the vertical position on the Y axis versus the field intensity on the X axis.

The same procedure used to obtain data from a known unfaulted insulator string is also used on a suspect insulator string. After the data is taken on the suspect string, it is graphed and compared to the graph from the unfaulted string. The resulting curves, which are in the form of parabolas, are then compared. The apex of the curve representing the electric field surrounding the faulted insulator will be shifted up or down, with respect to the curve of the unfaulted insulator, depending upon the position and the extent of damage in the insulator string. If the shift is below the apex of the unfaulted string, the fault is in the top half of the insulator string. If the shift is above the apex, the fault is in the lower one-half of the string.

The curves described above may be graphed from measurements taken off of a meter readout and physically plotted on graph paper or may be automatically plotted by a microprocessor-based system. The microprocessor-based system would first receive and store the data on the unfaulted insulator string. Data received from the probe on the faulted insulator string would be similarly stored and the sets of data would be compared and plotted using an algorithm. The result would clearly indicate whether the suspect insulator string should be replaced or noted for further observation.

In the method described above, it is possible to measure the electric field surrounding an individual insulator string when it is first installed and thus obtain a "fingerprint" of the string in its original, unfaulted condition. Subsequent field measurements of the string may be compared to the original measurement to determine whether there has been a deterioration in the string's insulating capacity over time. Alternatively, the current method may be used to compare an individual insulator to a reference insulator string which represents a benchmark standard to be met by all strings in the transmission system. Data corresponding to individual string "fingerprints" or to reference strings may be stored in computer memory or retained in graphical form for future comparison with field measurements.

The fault detector method of the present invention utilizes a spherical dipole 10, shown in FIG. 1, in combination with an electric field monitoring system comprising the components shown schematically in FIG. 2. The specific operational details of the spherical dipole are disclosed in "A Small, Accurate, Optically Isolated Electric Field Probe", the contents of which are incorporated herein by reference for all purposes. As may be seen in FIG. 2, the overall system comprises three major components: the sensor/transmitter unit (which also comprises the spherical dipole), an optical link, and a receiver/display unit.

The spherical dipole 10 comprises two aluminum hemispheres 12 and 14 separated by an insulated gap. In the dipole sensor used in the present invention, the required insulation is provided by a circuit board 15 wich is sandwiched between two threaded delrin rings 16 and 18 adapted to engage complementary threads on the hemispherical members 12 and 14, respectively. All of the necessary sensor circuitry is housed within the dipole and is electrically isolated from the effects of spurious signals. Data is transmitted from the dipole to the receiver/display unit by a long, glass fiber bundle link.

The sensor/transmitter circuitry comprises four functional units, as shown in FIG. 2: a differential amplifier, a voltage controlled subcarrier oscillator (VCO), a driver for the light emitting diode (LED), and a light emitting diode (LED). The operation of each of these components is well known in the art and, therefore, is not described in greater detail herein.

The optical linke used in the present invention comprises an optical fiber bundle comprising approximately 200 individual fibers. The optical link is coupled to the LED of the transmitter via a small hole in the lens of the LED with the fiber bundle being secured to the lens with an optical grade epoxy.

The receiver/display unit shown in FIG. 2 comprises the following functional blocks: a sensitive field effect transistor (photo FET), an amplifier, a phase-locked loop demodulator, a low-pass filter, a precision rectifier, and a digital panel meter. The photoFET is attached to the receiving end of the optical link and is used to convert the optical signal carried by the link into an electrical signal which may be amplified by the amplifier to a level compatible with the phase-locked loop demodulator. The demodulator is capable of demodulating the frequency modulated pulses transmitted by the VCO of the transmitter unit and thereby recover the desired signal.

Figure 4:
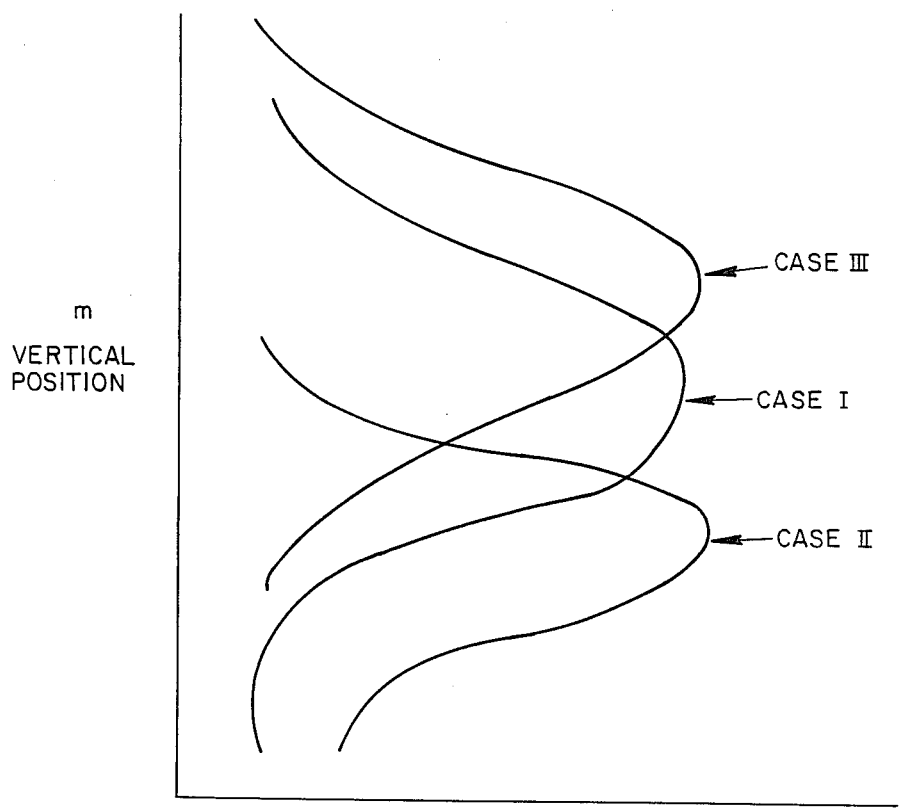
FIG. 4 is a graphical representation of electric field strength versus vertical position showing curves obtained for an unfaulted insulator and for a faulted insulator.

An experiment based on the method of the present invention was conducted using the test setup shown in FIG. 3. First, a high voltage transformer was used to energize a line separated by five individual insulators. Data were then obtained with the small spherical dipole probe at horizontal distances of 6", 12", and 18" from the string at vertical positions 1 through 13 as shown in FIG. 3. Initial baseline data were obtained with an unfaulted insulator. The insulator string was then faulted by a shorting bar between positions 8 and 10, and subsequently between positions 3 and 5. Data were again obtained under these shorted conditions. Data obtained from each of the three cases was plotted with each yielding a parabolic curve corresponding to the electric field "mapped" by the spherical dipole probe. The curves corresponding to the faulted strings were then compared to the curve of the unfaulted string. It was determined that the apex of each of the curves corresponding to the faulted strings had shifted with respect to the apex of the curve corresponding to the faulted string. FIG. 4 is a graphical representation of electric field strength versus vertical position showing curves corresponding to an unfaulted insulator and to each of the fault cases mentioned above. Case I corresponds to the curve obtained by plotting data obtained from an unfaulted insulator string. Cases II and III correspond to curves obtained by plotting data obtained from insulator strings having faults in the upper or lower portions, respectively of the string. These curves do not represent actual data obtained during the above-described experiment, but, rather, have been enhanced to better illustrate the method of the present invention.

The application of the spherical dipole of the present invention to the detection of faults in insulator strings is unique for a number of reasons. First, the spherical shape can be theoretically analyzed, thereby eliminating calibration procedures using exposure facilities. Second, the necessary probe electronics can be placed inside the sensor volume with the consequent elimination of field distortion due to the transmitter electronics package. The weight of the system is thereby reduced from several pounds to only several ounces. Third, the spherical shape provides the largest radius of curvature possible which serves both the minimize corona problems in high strength fields and also allows closer mapping of the fields near field perturbing objects. Finally, any distortion of the field normally experienced when using metallic cables is eliminated in the present invention through the use of a fiber optic link to transmit information from the probe to the receiver/display unit. The probe is attached to a telescoping fiberglass pole by a swivel mount. Other novel features in the present application of the spherical dipole include the following improvements in the electronic circuitry employed in the detection apparatus:

1. The stray capacitance associated with the electronics package inside the sphere volume is reduced by using a balanced input to the probe terminals.
2. Amplifier DC drift problems due to factors such as battery drain are eliminated by the utilization of a voltage controlled oscillator (VCO), as described above, in order to convert the received 60 Hz sine wave signal to a series of frequency modulated pulses which are then transmitted down the optical cable.
3. Battery life is increased by driving the light-emitting diode (LED) by large amplitude, short duration current pulses.

This method may also be used to determine the efficacy of insulating materials and other high voltage equipment, or to determine the electric field intensities beneath high voltage transmission lines. Furthermore, the method can be used for field mapping and flaw detection on insulating bushings of high voltage transformers, capacitors, and lightning arresters. Other applications include field mapping and flaw detection on insulation materials within a generating plant near equipment, such as a motor or a turbine. Further, the method can be used with virtually any insulating material where very high voltages are induced across large insulating surfaces.

While the invention method for utilizing a spherical dipole probe for detecting faults in high voltage transmission line insulators has been described in connection with the preferred embodiment, it is not intended to limit the invention to the particular form set forth, but on the contrary, it is intended to cover such alternatives, modifications, and equivalents, as may be included within the spirit and scope of the invention as designated by the appended claims.

We claim:

1. A method of detecting faults in an insulator having an associated electric field, comprising the steps of:
   placing an electric field detection means in a first electric field associated with a first insulator;
   moving said detection means to a plurality of points within said first electric field without allowing said detection means to physically contact said first insulator;
   obtaining a first set of data from said detection means at each of said points in said first electric field;
   processing said first set of data, thereby obtaining a numerical respresentation of the strength of said first electric field at each of said points;
   placing said electric field detection means in a second electric field associated with a second insulator;
   moving said detection means to a plurality of points within said second electric field without allowing said detection means to phyically contact said second insulator, said points in said second electric field corresponding to said points in said first electric field;
   obtaining a second set of data from said detection means at each of said points in said second electric field;
   processing said second set of data, thereby obtaining a numerical representation of the strength of said second electric field at each of said points;
   comparing the strength of said first and second electric fields at each of said points;
   generating an error signal for each said point at which said strength of said first electric field differs from said strength of said second electric field, each said error signal being proportional to the magnitude of difference between said first and second electric fields; and
   correlating each said error signal with the location of a fault on said second insulator.

2. A method according to claim 1, said first and second insulators each having a central longitudinal axis and said plurality of points being in a plane parallel to each said central longitudinal axis.

3. A method according to claim 1, said electric field detection means comprising a spherical dipole sensor.

4. A method according to claim 3, said electric field detection means further comprising a signal transmitting means contained within said dipole sensor, a signal receiving means external of said dipole sensor and an optical transmission means for communicating a signal from said signal transmission means to said signal receiving means.

5. A method according to claim 1, further comprising the steps of plotting said numerical representations of the strength of said first electric field and plotting said numerical representations of said second electric field, thereby obtaining a graphical representation of the strength of said first electric field and said second electric field.

6. A method according to claim 5, further comprising the step of comparing said graphical representations of said first and second fields to determine the location of a fault on said second insulator.

7. A method of detecting faults in an insulator having an associated electric field, comprising the steps of:
   a first placing of an electric field detection means in a first electric field associated with an insulator;
   moving said detection means to a plurality of points within said first electric field without allowing said detection means to physically contact said insulator;
   obtaining a first set of data from said detection means at each of said points in saif first electric field;
   processing said first set of data, thereby obtaining a numerical representation of the strength of said first electric field at each of said points;
   a second placing of said electric field detection means in a second electric field associated with said insulator;
   moving said detection means to a plurality of points within said second electric field without allowing said detection means to physically contact said insulator, said points in said second electric field corresponding to said points in said first electric field;
   obtaining a second set of data from said detection means at each of said points in said second electric field;
   processing said second set of data, thereby obtaining a numerical representation of the strength of said second electric field at each of said points;
   comparing the strength of said first and second electric fields at each of said points;
   generating an error signal for each said point at which said strength of said first electric field differs from said strength of said second electric field, each said error signal being proportional to the magnitude of difference between said first and second electric fields; and
   correlating each said error signal with the location of a fault on said insulator.

8. A method according to claim 7, said first and second insulators each having a central longitudinal axis and said plurality of points being in a plane parallel to each said central longitudinal axis.

9. A method according to claim 7, said electric field detection means comprising a spherical dipole sensor.

10. A method according to claim 9, said electric field detection means further comprising a signal transmitting means contained within said dipole sensor, a signal receiving means external of said dipole sensor and an optical transmission means for communicating a signal from said signal transmission means to said signal receiving means.

11. A method according to claim 7, further comprising the steps of plotting said numerical representations of the strength of said first electric field and plotting said numerical representations of said second electric field, thereby obtaining a graphical representation of the strength of said first electric field and said second electric field.

12. A method according to claim 11, further comprising the step of comparing said graphical representations of said first and second fields to determine the location of a fault on said second insulator.

13. A method of detecting faults in an insulator having an associated electric field, without the necessity of having physical contact with said insulator comprising the steps of:
   placing an electric field detection means in a first electric field associated with a first insulator;
   moving said detection means to a plurality of points within said first electric field;
   obtaining a first set of data from said detection means at each of said points in said first electric field;
   plotting said first set of data, thereby obtaining a graphical representation of the strength of said first electric field at each of said points, said graphical representation comprising a parabola having a first apex;

placing said electric field detection means in a second electric field associated with a second insulator;

moving said detection means to a plurality of points within said second electric field, said points in said second electric field corresponding to said points in said first electric field;

obtaining a second set of data from said detection means at each of said points in said second electric field;

plotting said second set of data, thereby obtaining a graphical representation of the strength of said second electric field at each of said points, said graphical representation comprising a parabola having a second apex;

comparing the graphical representation of said first and second electric fields to obtain a shift in the position of said second apex relative to said first apex;

correlating said shift of said second apex with the location of a fault on said second insulator.

14. A method according to claim 13, said first and second insulators each having a central longitudinal axis and said plurality of points being in a plane parallel to each said central longitudinal axis.

15. A method according to claim 13, said electric field detection means comprising a spherical dipole sensor.

16. A method according to claim 15, said electric field detection means further comprising a signal transmitting means contained within said dipole sensor, a signal receiving means external of said dipole sensor and an optical transmission means for communicating a signal from said signal transmission means to said signal receiving means.

* * * * *